US006447655B2

(12) United States Patent
Lantsman (10) Patent No.: US 6,447,655 B2
(45) Date of Patent: Sep. 10, 2002

(54) DC PLASMA POWER SUPPLY FOR A SPUTTER DEPOSITION

(76) Inventor: Alexander D. Lantsman, 303 Sea Spray La., Neptune, NJ (US) 07753

( * ) Notice: Subject to any disclaimer, the term of this patent is extended or adjusted under 35 U.S.C. 154(b) by 0 days.

(21) Appl. No.: 09/838,039

(22) Filed: Apr. 20, 2001

Related U.S. Application Data (60) Provisional application No. 60/207,453, filed on May 30, 2000.

(51) Int. Cl.[7] ............................................... C23C 14/34
(52) U.S. Cl. .............................. 204/298.08; 204/298.03
(58) Field of Search ...................... 204/192.13, 298.03, 204/298.08; 323/234, 205, 299, 318, 304

(56) References Cited

U.S. PATENT DOCUMENTS 6,007,879 A * 12/1999 Scholl .................... 204/192.12
6,051,114 A * 4/2000 Yao et al. ................ 204/192.3
6,190,512 B1  2/2001 Lantsman ............... 204/192.12

OTHER PUBLICATIONS

English abstract of JP 2–254160.*
Rossnagel, "Handbook of Plasma Processing Technology", Noyes Publications, 1990, USA, pp. 47–58.
Wasa, "Handbook of Sputter Deposition Technology", Noyes Publications, 1992, USA, pp. 97–122.
Roth, "Industrial Plasma Engineering", Institute of Physics Publishing, 1995, United Kingdom, pp. 283–390.

* cited by examiner

Primary Examiner—Steven H. VerSteeg (57) ABSTRACT

DC plasma power supply for a sputter deposition of material layers on a substrate includes a plasma controller and a plasma input for the settings of the output voltage and output current providing plasma ignition and termination with no arcing and no striking voltage. Pre-defined voltages are applied in the vacuum state before sputtering and after sputtering until vacuum is restored in a sputtering apparatus.

20 Claims, 11 Drawing Sheets

DC PLASMA POWER SUPPLY FOR A SPUTTER DEPOSITION

CROSS-REFERENCE TO RELATED APPLICATIONS

Provisional Patent Application No. 60/207,453 filed with U.S. PTO on May 30, 2000.

STATEMENT REGARDING FEDERALLY SPONSORED RESEARCH OR DEVELOPMENT

Not applicable

REFERENCE TO A MICROFICHE APPENDIX

Not applicable

BACKGROUND OF THE INVENTION

Present invention relates generally to power supplies technologies and specifically to the DC plasma supplies for a sputter deposition of material layers on a substrate, and it was originally disclosed in Provisional Patent Application No. 60/207,453 filed with US PTO on May 30, 2000.

DC plasma power supplies are used as sources of energy at a sputter deposition in the apparatuses, typically of a magnetron design, in the semiconductor industry. DC plasma power supplies are manufactured by the companies worldwide, including Advanced Energy Industries, Inc. of Fort Collins, Colo., USA.

Major drawbacks of the DC plasma power supplies of the prior art are intensive and repetitive arcing at plasma ignition and plasma termination and a need in the striking voltage to initiate a plasma in a sputtering apparatus of either magnetron or non-magnetron design.

Cumulative negative effects of the arcing are severe damage to substrates (wafers), caused by the induced particle contamination and soft X-rays, deterioration of electrical integrity of a sputtering apparatus and of a DC plasma power supply, and induced electromagnetic interference.

Plasma at arcing represents a short circuit and a DC plasma power supply generates at arcing the repetitive 0.1–10 microsecond pulses (surges) of the output current typically exceeding 10–100 times the nominal output current at a sputter deposition and reaching hundreds of amps. Repetition rate of these pulses may vary from 0.1 to 10–50 kHz. The surges of the output current result in micro-evaporation of the target material and in the particle contamination of a substrate.

The spikes of the output voltage of 1.5–2.5 kV accompany the surges of the current at arcing and these instabilities may last from several to hundreds of milliseconds. Arcing in a sputtering apparatus also results in release of the particles of different origin otherwise suspended by stable plasma off the perimeter of a substrate. At arcing these particles fall onto a substrate and contaminate it, representing one of the major sources of the yield losses at sputtering.

To initiate plasma a DC plasma power supply of the prior art produces a striking voltage, also typically in a range of 1.5–2.5 kV, and a striking voltage itself promotes arcing in a sputtering apparatus at plasma ignition.

Soft X-rays are generated at arcing by the spikes of the output voltage exceeding or about 1 kV, including the striking voltages, and they are detrimental to the dielectric layers on a substrate and also represent an environmental hazard.

High voltage spikes also deteriorate electrical integrity and reliability of a sputtering apparatus, specifically, of a cathode assembly. High voltage spikes and surge currents at arcing deteriorate electrical integrity and reliability of a DC plasma power supply of the prior art. They are also a source of AC and RF electrical interference for devices and instruments of a sputtering apparatus and of the other electronic systems. Arcing at plasma ignition and plasma termination tends to be supported by the energy stored in the DC plasma power supplies of the prior art. This phenomenon dictates use of the reactive components with the reduced nominal value in the output filters of these power supplies. It results in the less effective filtering and higher ripples of the output voltage and output current during a sputter deposition. These ripples themselves may promote various plasma instabilities and arcing at sputtering.

The invented DC plasma power supply provides plasma ignition and termination with no arcing regardless of the amount of energy stored in the power supply itself, offering more margins for better filtering and lower ripples at sputtering.

BRIEF SUMMARY OF THE INVENTION

A DC plasma power supply of the present invention corrects the drawbacks of the prior art. Present invention is based on a theory of the plasmas, teaching that a DC plasma discharge becomes stable at the applied voltages greater than a specific voltage Vmin (Handbook of plasma processing technology, S. M. Rossnagel et al 1990, Noyes Publications, pp. 47–58; Industrial plasma engineering, J. R. Roth 1995, IOP Publishing, pp. 283–390; Handbook of sputter deposition technology, K. Wasa et al 1992, Noyes Publications, pp. 97–122; U.S. Pat. No. 6,190,512 Soft plasma ignition in plasma processing chambers).

Value of voltage Vmin depends on composition and pressure of the process gas(es), design properties of a sputtering target and a sputtering apparatus, and it can be measured prior to the processing of a product substrate.

Results of these measurements are used in the invented DC plasma power supply to define the settings for the arcing free plasma ignition and termination.

The invented DC plasma power supply effectively eliminates arcing, high voltage spikes, and soft X-ray radiation at plasma ignition and at plasma termination during a sputter deposition, and it does not require a striking voltage to initiate a plasma.

The invented DC plasma power supply reduces particle contamination and damage to a substrate at a sputter deposition. It also increases electrical integrity of a sputtering apparatus and its own electrical integrity by limiting the output voltages and output currents to the values required for sputtering. It also reduces the AC and RF electrical interference and a soft X-ray hazard.

These and other advantages of the invented DC plasma power supply are achieved by means of preventing exposure of the process gas(es) at sputtering to the output voltages lower than Vmin, by means of dynamic control of the mode of operation, and by means of controlled and gradual transitions from a gaseous state to a plasma state and from a plasma state to a gaseous state in a sputtering apparatus.

It is objective of the present invention to increase yield at a sputter deposition by eliminating arcing in a sputtering apparatus at plasma ignition and termination.

It is another objective of the present invention to increase electrical integrity of a sputtering apparatus.

It is another objective of the present invention to increase electrical integrity of a DC plasma power supply.

It is another objective of the present invention to reduce the AC and RF electromagnetic interference and the soft X-ray hazard caused by arcing at plasma ignition and termination.

It is another objective of the present invention to reduce limitation to filtering of the ripples of the output voltage and output current of a DC plasma power supply.

The invention is particularly useful in production by means of a sputter deposition of the Very Large Scale Integration (VLSI) devices in the semiconductor industry, optical and magneto-optical media, ultra thin film magnetic heads for computer hard drives, and in other related industries.

The above and other objectives and advantages of the present invention shall be made apparent from the accompanying drawings and the description thereof.

BRIEF DESCRIPTION OF THE DRAWINGS

The accompanied drawings, which are incorporated in and constitute a part of this application, illustrate embodiments of the invention and, together with a general description of the invention given above, and with the detailed description of the embodiments given below, serve to explain the principles of the invention.

FIGS. 1–11 share the same denotations for common functional devices, inputs, outputs, signals, and time intervals.

DETAILED DESCRIPTION OF THE INVENTION

At a sputter deposition a DC plasma power supply typically operates in the power mode, and between cycles of a sputter deposition it operates in the voltage mode. A mode of operation is a hardware configuration and/or a software algorithm used to regulate the output of a power supply. In the power mode Pout=Vout*Aout=Set Point, in the voltage mode Vout=Set Point, in the current mode Aout=Set Point, and in the energy mode Eout=Pout*(Process Time)=Set Point. Here Pout, Vout, Aout and Eout are the output power, output voltage, output current and output energy respectively, and "Set Point" corresponds to a commanded value at the output of a DC plasma power supply. Typically, the power mode provides the most consistent performance of the deposited films, while the energy mode is used for the most delicate sputtering processes. The voltage mode is commonly used for the sputtering apparatus and personnel safety reasons between the cycles of sputtering.

Further in the description of the present invention the power and the energy modes of operation may be assumed interchangeably, wherever the power mode is mentioned. Settings Vmin can be measured with a test substrate in the same sputtering apparatus filled with the gas(es) at pressure per the process recipe prior to the processing of a product substrate, as illustrated on FIG. 9. At these measurements a DC plasma power supply, either invented or of the prior art, is set to the voltage mode. During the test a commanded value Vp of the output voltage is slowly increased from 0 (zero) to Vp(max), corresponding to a stable plasma discharge in the sputtering apparatus, and further Vp is slowly decreased back from Vp(max) to 0 (zero).

Figure 9:
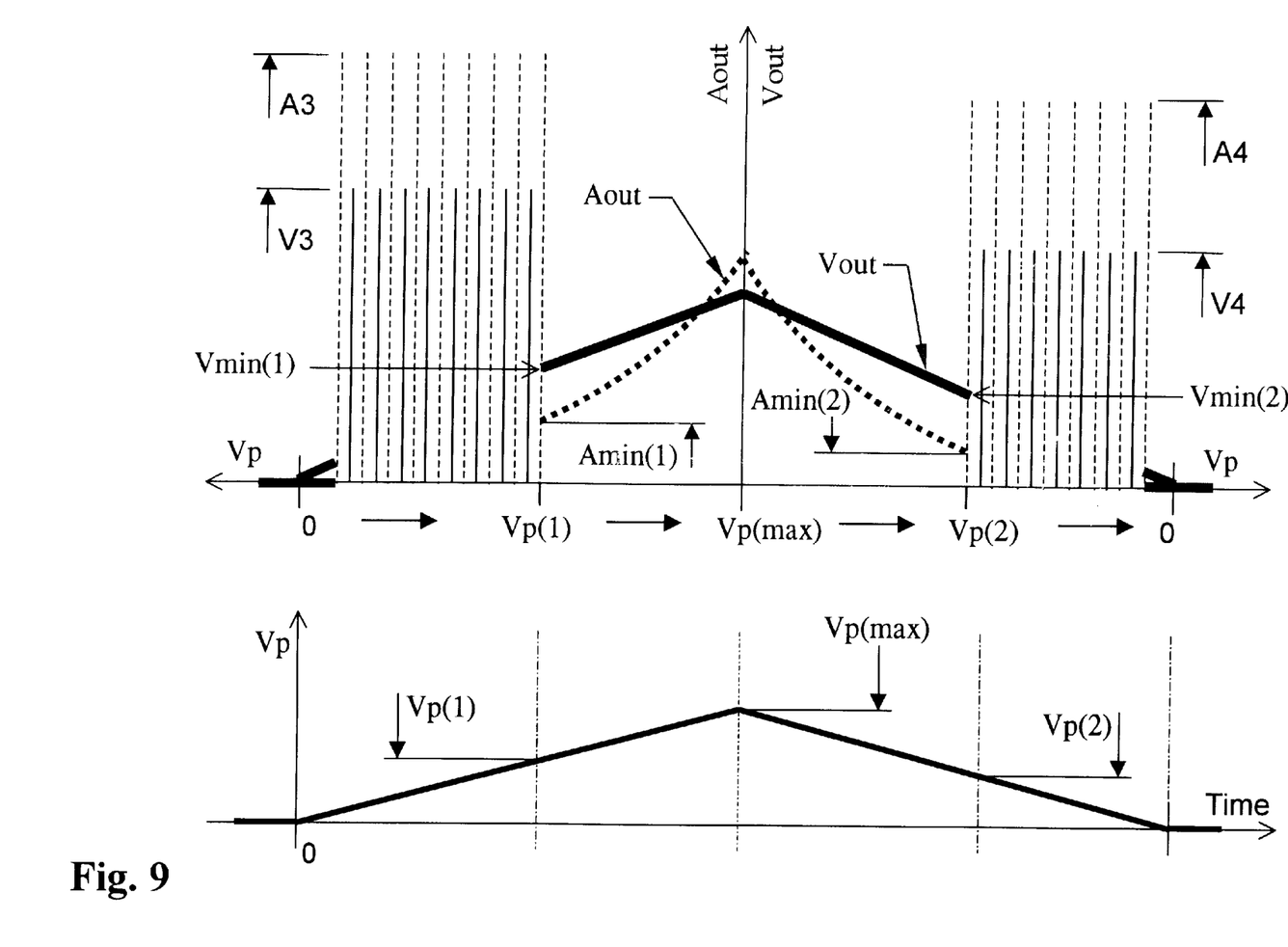
FIG. 9 is a diagram illustrating method of measurement of settings Vmin, Amin.

Minimal steady state output voltages Vmin(1), Vmin(2) and output currents Amin(1), Amin(2) at the voltages Vp(1) and Vp(2) respectively are measured during this test. Voltage Vp(1) relates to the minimal commanded value of the output voltage at plasma ignition corresponding to a stable plasma discharge after the arcing state. Respectively, voltage Vp(2) relates to the minimal commanded value of the output voltage at plasma termination corresponding to a stable plasma discharge before the arcing state. Voltage Vp(max) relates to a commanded value of the output voltage greater than Vp(1) and Vp(2) but lower or about a typical value at sputtering.

Values V3, A3 and V4, A4 (not to scale) are a graphical illustration of the repetitive peak output voltages and surge currents during the arcing state at plasma ignition and termination, respectively.

Settings Vmin are defined as the minimal output voltages Vmin(1), Vmin(2) providing stable plasma discharges. The corresponding values for the output current and the output power at Vout=Vmin are Amin and Pmin=Vmin*Amin respectively. At the output voltage equal to or greater than Vmin, voltage at a sputtering target is stable. As indicated on FIG. 9, voltages Vmin(1) and Vmin(2) may differ. Voltage Vmin(1) at plasma ignition is expected to be higher than voltage Vmin(2) at plasma termination. Either both values of Vmin(1) and Vmin(2) may be communicated to the invented power supply, one for each of the corresponding transitions specifically, or just the greater one of these voltages. For simplicity of the description only, further in disclosure of this invention and pictorially on FIG. 4 and FIG. 6, voltage Vmin(1) as a greater of the voltages Vmin(1), Vmin(2) is chosen as the single value for Vmin.

In embodiments of the invented power supply shown on FIGS. 1–3, 5–7 are used settings V1=Vmin+Vs, A1=Amin+As, P1=Pmin+Ps=V1*A1=(Vmin+Vs)*(Amin+As), where Vs, As, Ps are optional safety margins. Typically, safety margins Vs, As and Ps are 10–100 times smaller than Vmin, Amin, and Pmin, respectively.

The purpose of the safety margins is to assure that at plasma ignition and termination the output voltage of the invented DC plasma power supply of an individual physical design, or more accurately voltage at the target assembly of a sputtering apparatus, does not decrease below Vmin during the transitions of the mode and of the output. In practical systems there is also a small but finite voltage drop associated with losses in the wiring between the power supply and a sputtering apparatus. This voltage drop may be included in either Vmin or Vs. It is specifically small at the arcing free plasma ignition and termination provided by the invented power supply.

In disclosure of the present invention a voltage drop due to the losses in the wiring is considered included in the margin Vs. Accordingly, no distinction is further made between the output voltage of the invented power supply and the voltage at the target assembly of a sputtering apparatus.

Setting V1 is substantially smaller than the output voltage at sputtering. Current A1 at Vout=V1 is typically 10–100 times smaller than a typical current at sputtering, and the same is true for the output power P1. For practical purposes, at Vout=V1 a sputter deposition has not started yet, but the process gas(es) is pre-ignited and a weak but stable plasma is established in a sputtering apparatus. Values of Vmin and Amin can be further reduced by means of external sources of ionization, by increasing temporarily pressure of the process gas(es) in a sputtering apparatus ("pressure bursts") and by other means known to those skilled in the art.

Figure 1:
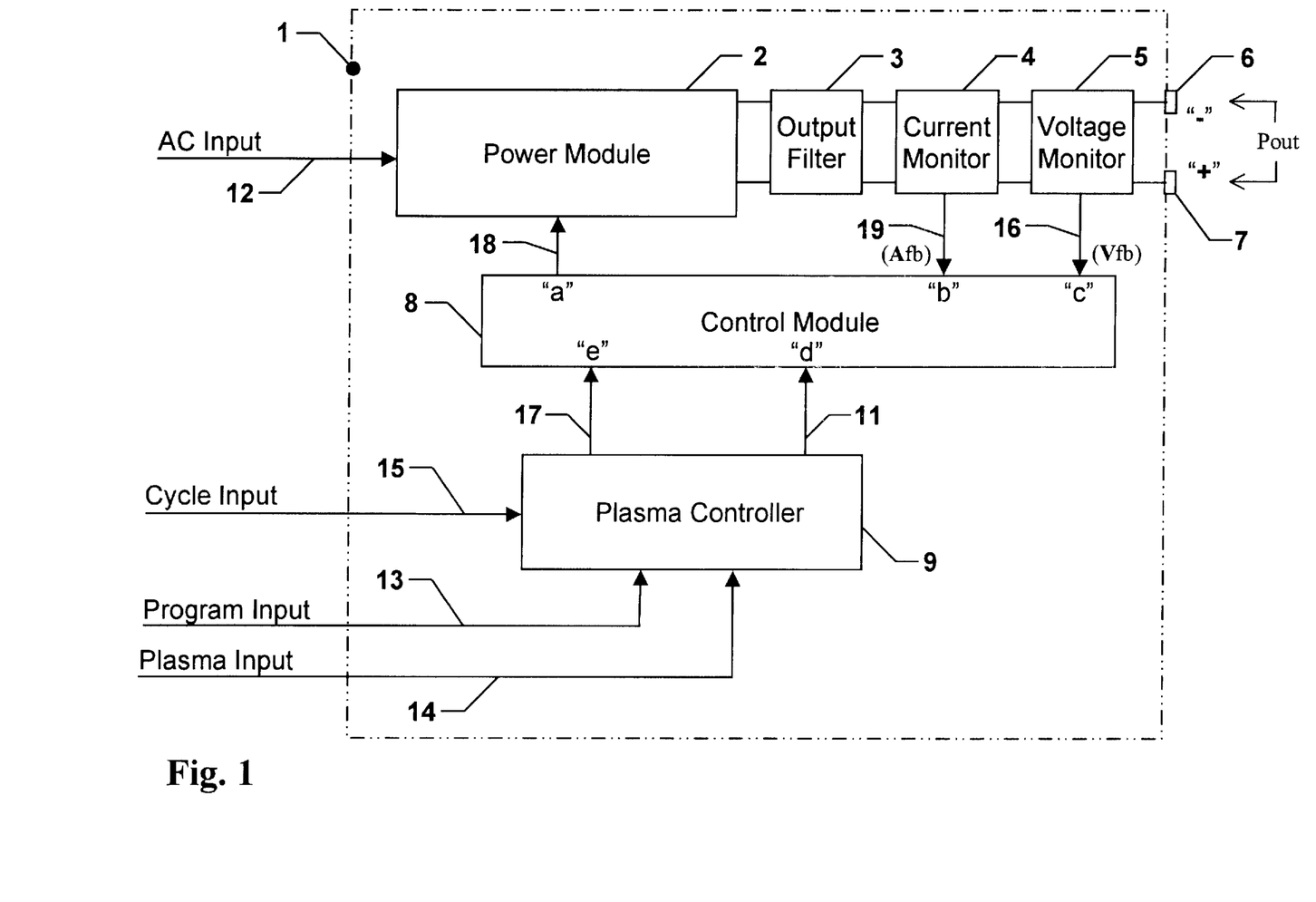
FIG. 1 is a schematic view of one embodiment the invented DC plasma power supply.

FIG. 1 illustrates DC plasma power supply 1 in accordance with one embodiment of the present invention. AC power from an external source is transmitted to power module 2 via AC input 12. Module 2 converts AC power in the highly regulated DC power, delivered through output filter 3, current monitor 4, and voltage monitor 5 to output terminals 6, 7. Typically, power supply 1 has the floating output terminals with negative terminal 6 connected to a target assembly and positive terminal 7 connected to the chassis of a sputtering apparatus.

A sputtering apparatus provides interfaces to program input 13, to plasma input 14, and to cycle input 15. Inputs 13–15 can be implemented as analog, digital or manual means or can be represented by a data interface like RS-232, etc. In description of the present invention further arbitrarily assumed and presented pictorially on FIG. 4, 8 that inputs 13, 14 are analog inputs, and input 15 is a digital input.

Commanded value of the output at terminals 6, 7 is communicated via input 13. Input 14 is used for communicating the settings Vmin, Amin. Via input 15 are communicated the beginning and the end of a cycle of a sputter deposition, defined as transition of a sputtering apparatus from the vacuum state before introduction and back to the vacuum state after evacuation of the process gas(es) respectively.

Typically, before and after a cycle of a sputter deposition a sputtering apparatus via input 15 defines the voltage mode for power supply 1 and via input 13 sets the output voltage Vout to 0 (zero).

Power supply 1 may also have other interfaces to a computerized sputtering apparatus and/or manual controls, displays, and other supplemental means.

Control module 8 administers the output and mode of operation of power supply 1. Module 8 is connected to module 2 via interface 18 (output "a"), to monitors 4 and 5 via interfaces 19 and 16 (inputs "b", "c"), and to plasma controller 9 via mode interface 11 and output interface 17 (inputs "d", "e").

Module 8 administers the mode of operation of power supply 1 by responding to interface 11 and it sets the output at terminals 6 and 7 by responding to interface 17. Monitors 4 and 5 provide module 8 with the output current feedback Afb and output voltage feedback Vfb, respectively.

Transitions between the modes are executed with no output voltage drop below Vmin. Plasma controller 9 is connected to inputs 13, 14 and 15 and via interfaces 11 and 17 to inputs "d" and "e" of module 8, administering the mode of operation and the output. At the beginning of the cycle of a sputter deposition controller 9 confirms the voltage mode and also switches control over the output from input 13 to input 14.

During a cycle of a sputter deposition controller 9 defines settings V1, P1 for the output voltage and output power at plasma ignition and termination and provides dynamic control over a mode of operation of power supply 1.

If a commanded value of the output power per input 13 is lower than the setting P1, controller 9 via interface 11 and module 8 sets power supply 1 to the voltage mode, and via interface 17 and module 8 sets the output voltage at terminals 6, 7 to V1.

If a commanded value of the output power per input 13 is greater than the setting P1, controller 9 via interface 11 and module 8 sets power supply 1 to the power mode and switches control over the output of power supply 1 at terminals 6, 7 to input 13.

When a commanded value per input 13 is equal to P1 it corresponds to a request of the same output voltage V1 and output current A1 as set up by controller 9. As a result, the described transitions between the modes and of the output are performed with no output voltage drop below Vmin as assured by the safety margins of a sufficient value. During a cycle of a sputter deposition after a sputtering apparatus is filled with the process gas(es), a sputter deposition begins by communicating via input 13 a commanded value of the output power at terminals 6, 7.

Until a sputtering apparatus is filled with the process gas(es), a commanded value per input 13 is equal to 0 (zero) and thus lower than setting P1.

Controller 9 holds power supply 1 in the voltage mode and sets the output voltage at terminals 6, 7 to V1 starting from the vacuum state until a sputtering apparatus is filled with the process gas(es) and until a commanded value per input 13 starts exceeding setting P1. As a result, process gas(es) during plasma ignition is not exposed to voltages lower than Vmin.

As a commanded value per input 13 starts exceeding the setting P1, controller 9 switches power supply 1 from the voltage mode to the power mode and at the same time it switches control over the output at terminals 6, 7 from input 14 to input 13.

Further the output power increases from P1 to a commanded level of P2. The output voltage and output current at Pout=P2 are V2 and A2 respectively. Output power P2 may vary during sputtering, and later it stays at a level higher than P1 till the end of a sputter deposition.

At the end of a sputter deposition a commanded value per input 13 decreases from P2 to 0 (zero). Accordingly, as it decreases to the value of setting P1, controller 9 switches power supply 1 back to the voltage mode and sets the output voltage at terminals 6, 7 to V1. Voltage V1 stays applied until vacuum is restored in a sputtering apparatus. As a result, process gas(es) during plasma termination is not exposed to voltages lower than Vmin.

At the end of the cycle of a sputter deposition controller 9 confirms the voltage mode and also switches control over the output from input 14 back to input 13. Power supply 1 stays in the voltage mode till the beginning of the next cycle of sputtering, while the output voltage Vout is set to 0 (zero) per input 13.

If the output power temporarily decreases below setting P1 during a sputter deposition, power supply 1 will terminate and re-ignite plasma with no arcing and no need in a striking voltage, as described above.

Figure 2:
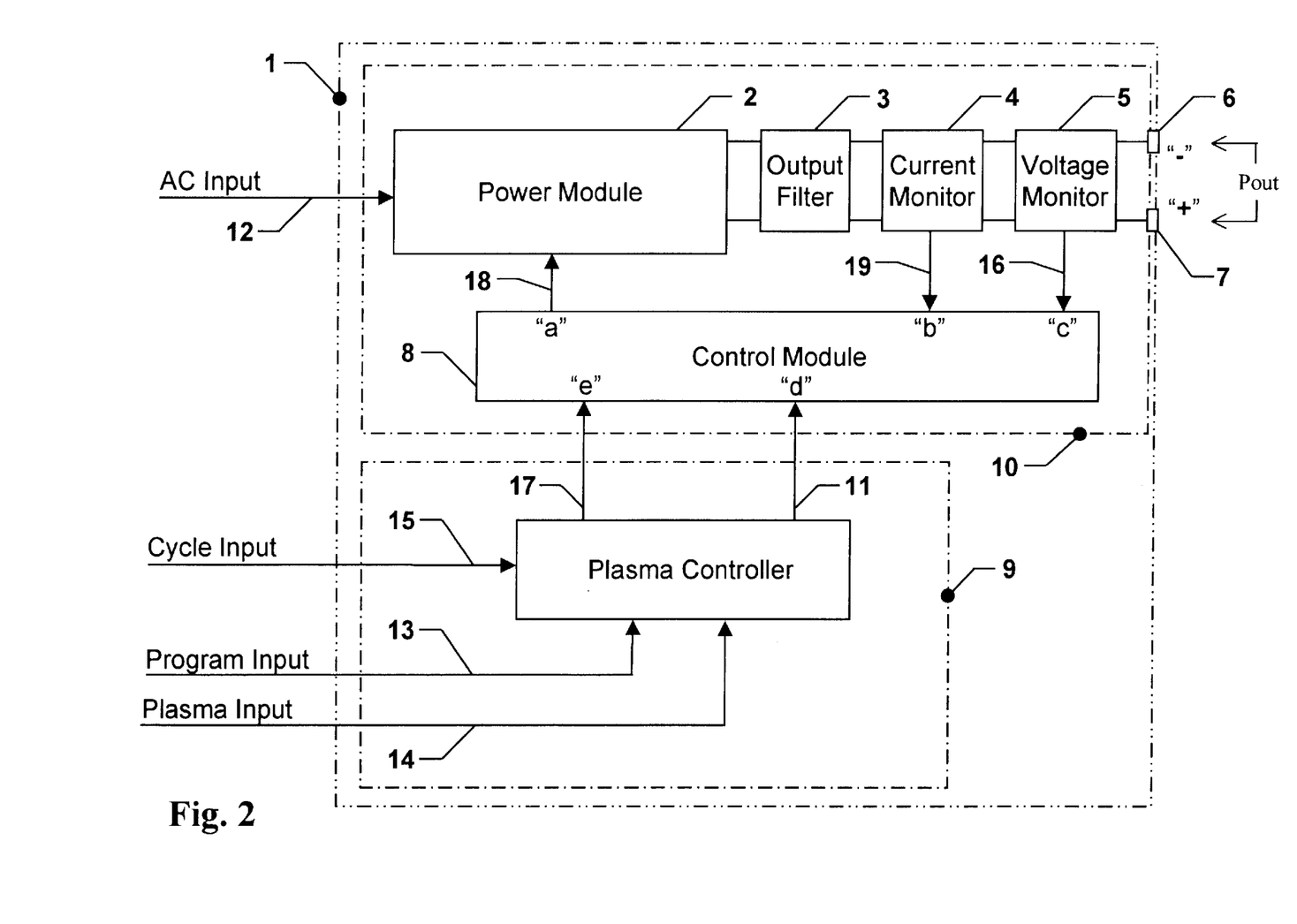
FIG. 2 is a schematic view of another embodiment of power supply 1 shown on FIG. 1.
Figure 10:
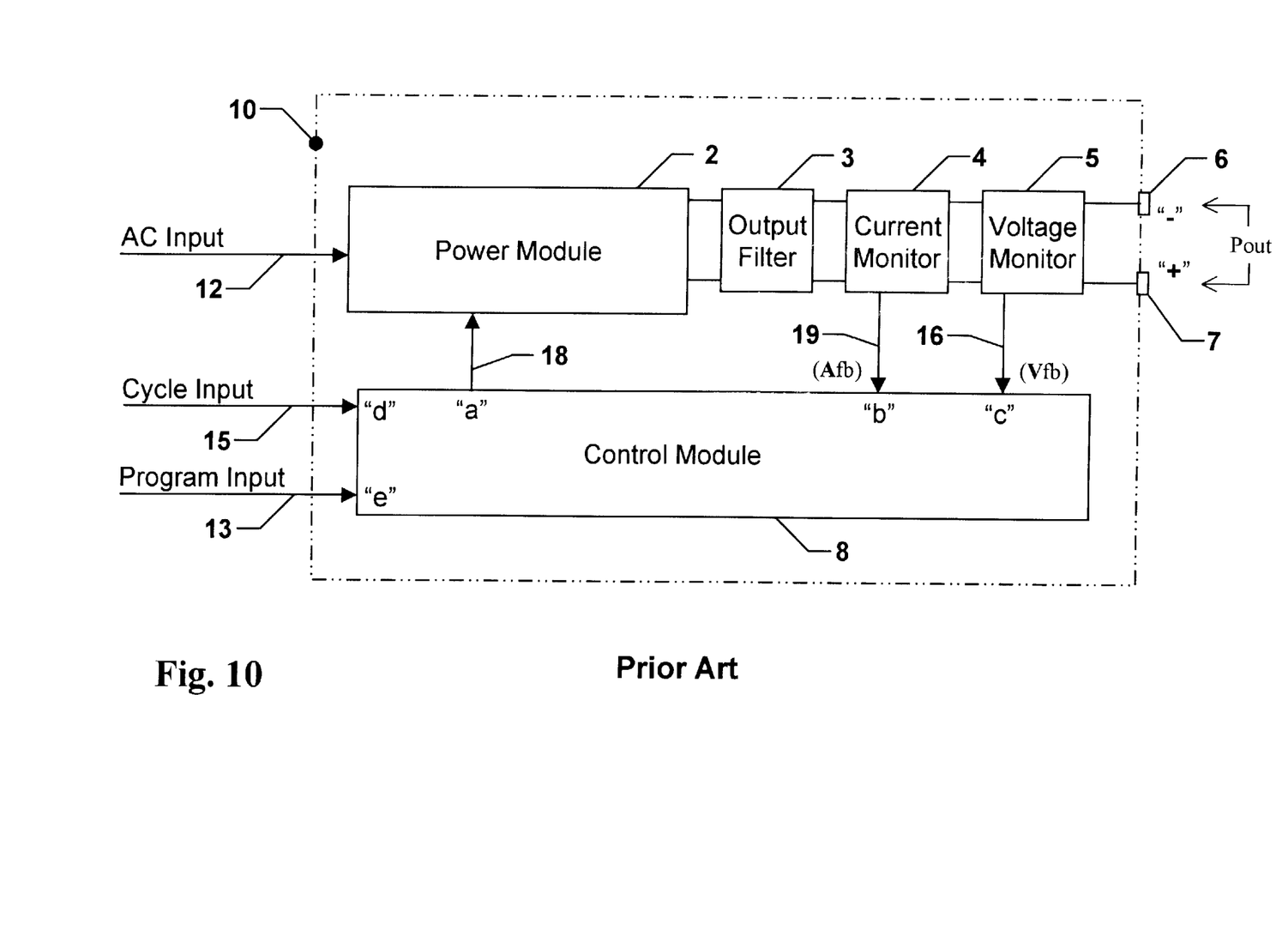
FIG. 10 is a schematic view of a DC plasma power supply of the prior art.

In another embodiment of power supply 1 shown on FIG. 2, controllers 9 is a stand-alone apparatus interfaced with a sputtering apparatus and with DC plasma power supply 10 of the prior art (FIG. 10). In other embodiments of power supply 1 the elements and functions of controller 9 may be in part or fully incorporated in the means of power supply 10 and of a sputtering apparatus.

Figure 3:
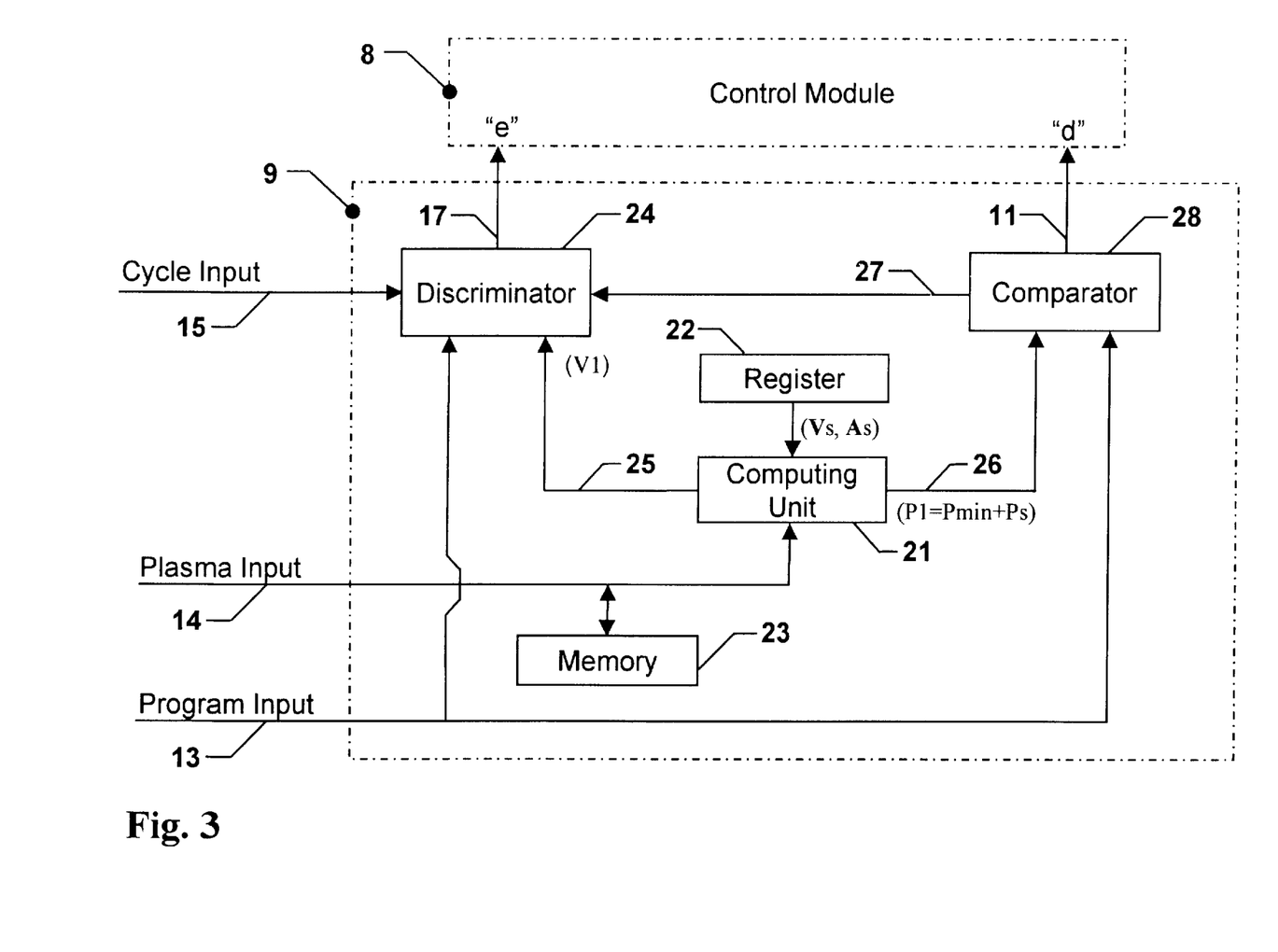
FIG. 3 is a schematic view of embodiment of plasma controller 9 of power supply 1 shown on FIGS. 1–2.

In embodiment shown on FIG. 3, controller 9 comprises read-write memory 23, register 22, comparator 28, computing unit 21, and discriminator 24. Settings Vmin, Amin are communicated to unit 21 via interface 14. Register 22 contains codes of the safety margins Vs, As, and unit 21 calculates settings V1, A1, and P1. In memory 23 are stored and available for retrieval setting Vmin, Amin and the settings calculated by unit 21.

Comparator 28, unit 21, and discriminator 24 can be implemented either by means of electronic hardware or as software programs or as a combination of thereof.

Setting V1 is communicated via interface 25 to discriminator 24, and setting P1 is communicated via interface 26 to comparator 28. Comparator 28 via interface 11 and module 8 sets power supply 1 to the voltage mode if a commanded value per input 13 is lower than setting P1, otherwise it sets power supply 1 to the power mode.

Input 15 and comparator 28 via interface 27 also controls the state of discriminator 24:

before and after a cycle of a sputter deposition (input 15 is in the inactive state):
discriminator 24 connects input 13 to module 8 and disconnects unit 21 from module 8; these commutations set power supply 1 to the voltage mode and also set the output voltage to 0 (zero) per input 13;

during a cycle of a sputter deposition (input 15 is in the active state):
in the voltage mode (a commanded value at input 13 is lower than setting P1):
discriminator 24 connects unit 21 to module 8 and disconnects input 13 from module 8; and these commutations set the output voltage to V1 at plasma ignition and plasma termination;

in the power mode (a commanded value at input 13 is greater than setting P1):
discriminator 24 connects input 13 to module 8 and disconnects unit 21 from module 8; and these commutations set the output power to a commanded value per input 13.

Figure 4:
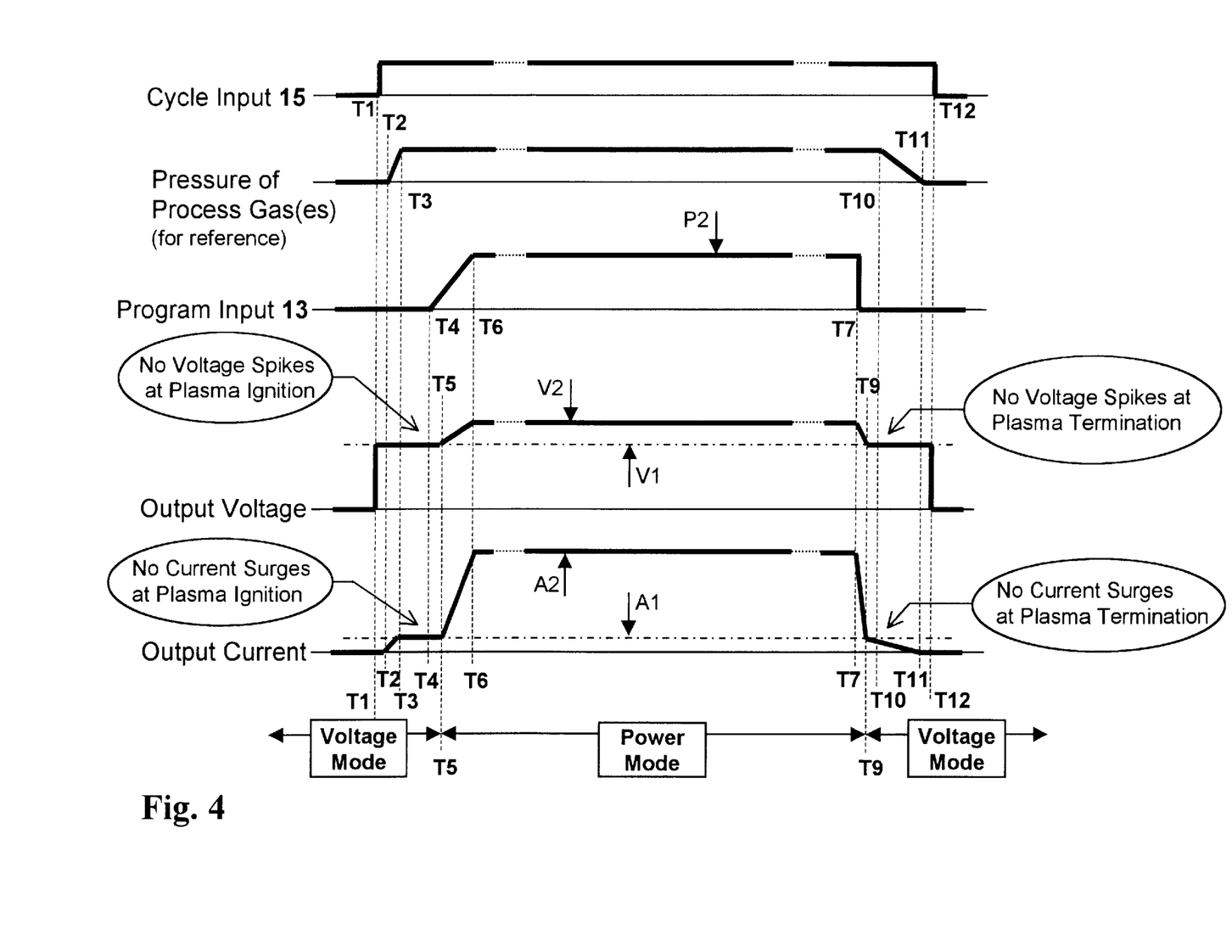
FIG. 4 is a typical timing diagram of embodiments shown on FIGS. 1–3.

A typical timing diagram of a sputter deposition with power supply 1 is shown on FIG. 4. On or prior to T1 settings Vmin, Amin are communicated to controller 9 by a sputtering apparatus via input 14, retrieved from memory 23 or entered manually in controller 9. At T<T1 before a cycle of sputtering begins a signal at input 15 is in the inactive state, arbitrarily shown as a low state. In response to input 15, controller 9 via interface 11 and module 8 sets power supply 1 to the voltage mode. At the same time controller 9 via interface 17 and module 8 sets the output voltage at terminals 6, 7 to 0 (zero) as commanded per input 13 by a sputtering apparatus between the cycles of deposition. At T1 a sputtering apparatus starts a cycle of a sputter deposition by setting the signal at input 15 to the active state, arbitrarily shown as a high state. Controller 9 continues to hold power supply 1 in the voltage mode but it switches control over the output from input 13 to input 14 and sets the output voltage to V1 till a commanded value per input 13 is lower than P1.

At T2 process gas(es) starts filling a sputtering apparatus in presence of the output voltage V1 applied to a sputtering target.

At T3 pressure of the process gas(es) reaches the level per a process recipe.

At T4 a commanded value of the output power at input 13 starts increasing from the initial value of 0 (zero) reaching P1 at T5, and after T5 it exceeds the setting P1.

Accordingly, at T5 controller 9 via interface 11 and module 8 switches power supply 1 from the voltage mode to the power mode and switches control over the output at terminals 6, 7 to input 13. These transitions are executed with no output voltage drop below Vmin, and it is beneficial, but not critical, if they take little time.

By T6 the a commanded value of the output power per input 13 increases to P2 and further it stays at a level higher then P1 till T7.

At T7 a sputtering apparatus sets a commanded value per input 13 to 0 (zero), and power supply 1 starts gradual transitioning of the output power from P2 to 0 (zero).

By T9 the output power decreases from P2 to P1, and after T9 it continues decreasing reaching Pout=0 at T11. Accordingly, at T9 controller 9 switches power supply 1 back to the voltage mode and switches control over the output at terminals 6, 7 from input 13 to input 14, thus setting the output voltage to V1. These transitions are executed with no output voltage drop below Vmin, and it is beneficial, but not critical, if they take little time. Voltage V1 stays until vacuum is restored in a sputtering apparatus.

At T10 evacuation of the process gas(es) starts, and by T11 vacuum is restored in a sputtering apparatus.

At T12 a sputtering apparatus sets signal at input 15 to the inactive state and sets a commanded value per input 13 to 0 (zero). Accordingly, at T12 controller 9 confirms the voltage mode for power supply 1, sets the output voltage to 0 (zero), and a cycle of a sputter deposition is completed.

Power supply 1 stays in the voltage mode from T9 to T5 of the next cycle of sputtering. Power supply 1 provides the free of arcing plasma ignition and termination and it does not require a striking voltage to initiate plasma in a sputtering apparatus.

Figure 5:
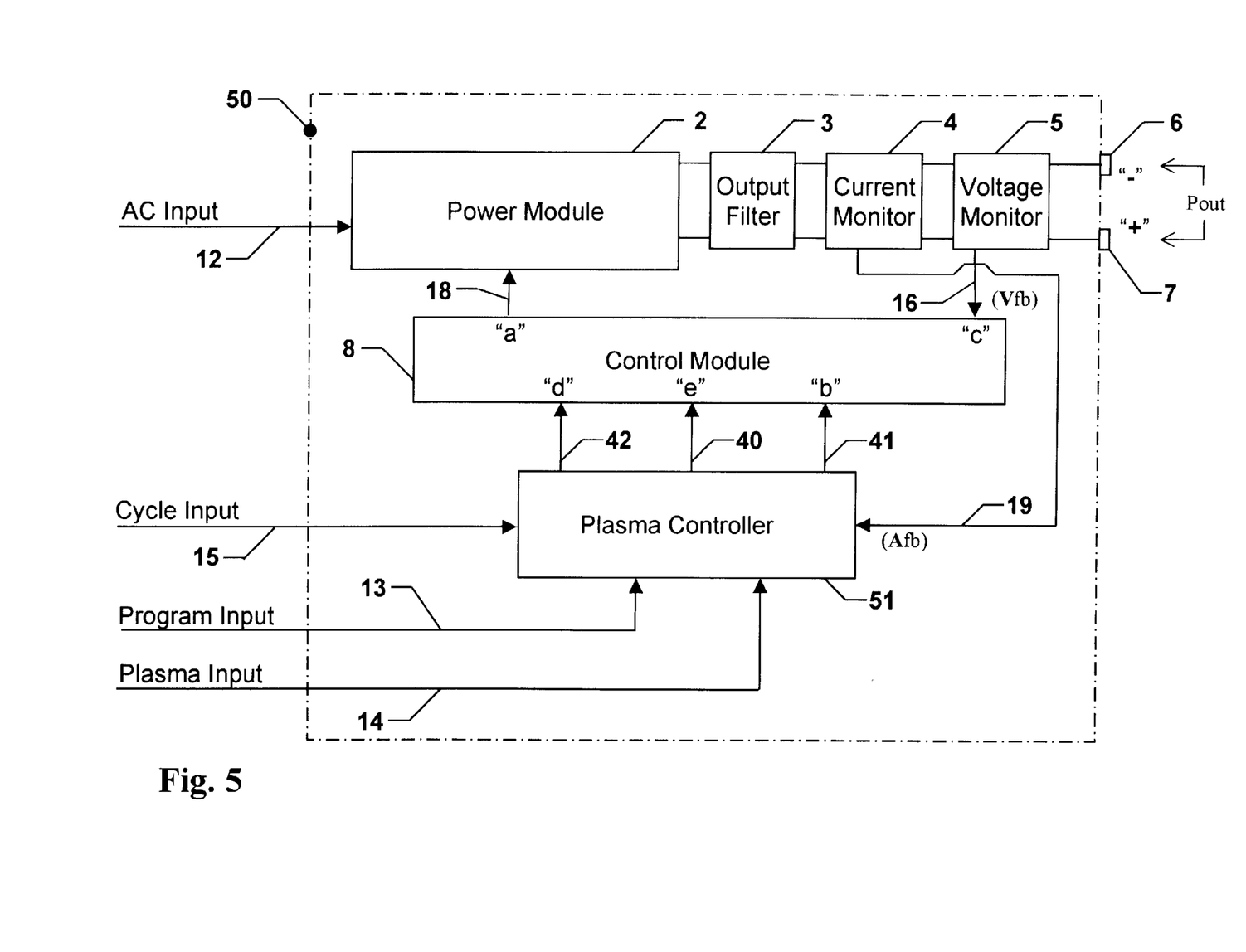
FIG. 5 is a schematic view of another embodiment the invented DC plasma power supply.

Another embodiment of the present invention is shown on FIG. 5. In this embodiment DC plasma power supply 50 operates during plasma ignition and termination in the power mode, but in a way preventing exposure of the process gas(es) to the output voltages lower than Vmin.

Plasma controller 51 is connected to inputs 13, 14 and 15, to monitor 4 via interface 19, to inputs "e", "b", and "d" of module 8 administering a commanded value at the terminals 6 and 7, feedback Afb, and a mode of operation via interfaces 40, 41, and 42 respectively.

Before and after a cycle of sputter deposition a sputtering apparatus sets a signal at input 15 to the inactive state. In response, controller 51 via interface 42 and module 8 sets power supply 50 to the voltage mode. At the same time controller 51 connects input 13 via interface 40 to module 8, setting the output voltage to 0 (zero).

At the beginning of a cycle of sputtering a signal at input 15 is set to the active state by a sputtering apparatus. In response, controller 51 via interface 42 and module 8 switches power supply 50 from the voltage mode to the power mode while the sputtering apparatus is still in the vacuum state. Active level of a signal at input 15 also enables controller 51 to replace a signal per input 13 and feedback Afb: a signal per input 13 is replaced with the setting P1, and feedback Afb is replaced with the setting A1. Settings P1, A1 are transmitted to module 8 via interfaces 40 and 41 respectively. It is beneficial, but not critical, if setting A1 is processed by module 8 faster than setting P1. In the power mode of operation these commutations result in module 8 setting the output voltage to P1/A1=V1, and it happens before introduction of the process gas(es) while a sputtering apparatus is still in the vacuum state. As a result, at plasma ignition there is no exposure of the process gas(es) to the voltages lower than Vmin. These commutations stay during a cycle of a sputter deposition till a commanded value per input 13 is lower than setting P1.

After a sputtering apparatus is filled with the process gas(es), a commanded value of the output power per input 13 starts increasing. As it reaches a level exceeding the setting P1, control over the output at terminals 6, 7 is switched by controller 51 back to input 13 and to monitor 4.

At the end of a sputter deposition a commanded value of the output power per input 13 starts decreasing from P2 to 0 (zero). Accordingly, as it decreases below setting P1, controller 51 replaces a signal per input 13 and feedback Afb with settings P1 and A1, respectively. In the power mode of operation these commutations result in module 8 setting the output voltage to P1/A1=V1, and it happens before evacuation of the process gas(es) from a sputtering apparatus started.

Voltage V1 stays applied till vacuum is restored in a sputtering apparatus at the end of the cycle of sputtering. As a result, at plasma termination there is no exposure of the process gas(es) to the voltages lower than Vmin.

At the end of the cycle of a sputter deposition a sputtering apparatus sets a signal at input 15 to the inactive state. In response, controller 51 via interface 42 and module 8 switches power supply 50 back to the voltage mode and switches control over the output at terminals 6, 7 from input 14 to input 13 and monitor 4. Power supply 50 stays in the voltage mode till the beginning of the next cycle of sputtering, with the output voltage Vout set to 0 (zero) per input 13.

When a commanded value per input 13 is equal to P1 it corresponds to a request at the described commutations of the same output voltage V1 and output current A1 as set up by controller 51. As a result, these commutations can be performed with no output voltage drop below Vmin as assured by a safety margins of a sufficient value. If the output power temporarily decreases below setting P1 during a sputter deposition, power supply 50 will terminate and re-ignite plasma with no arcing and no need in a striking voltage, as described above.

Figure 6:
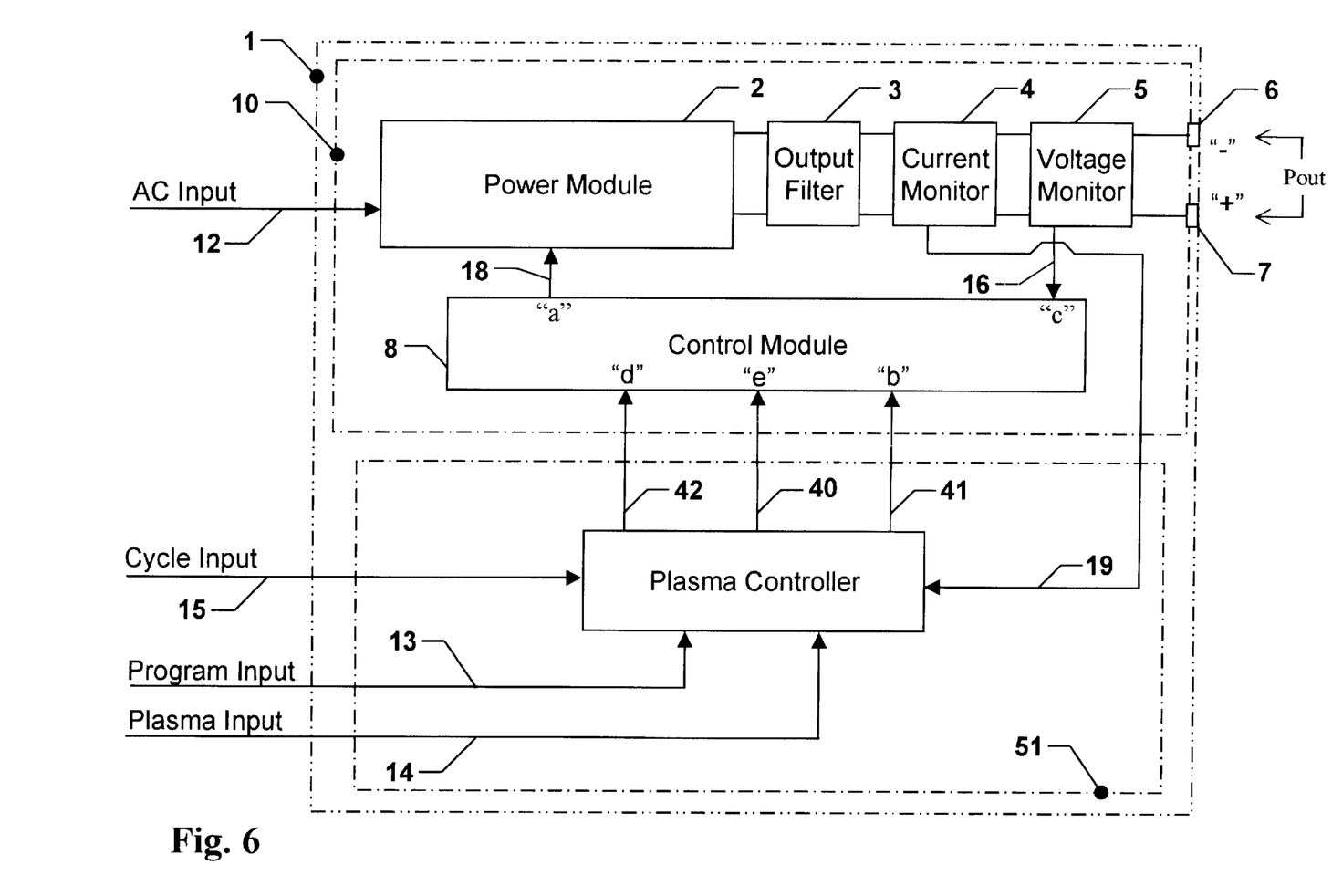
FIG. 6 is a schematic view of another embodiment of power supply 50 shown on FIG. 5.

In another embodiment of power supply 50 shown on FIG. 6, controllers 51 is a stand-alone apparatus interfaced with a sputtering apparatus and with DC plasma power supply 10 of the prior art (FIG. 10). In the other embodiments of power supply 50 the elements and functions of controller 51 may be in part or fully incorporated in the means of power supply 10 and of a sputtering apparatus.

Figure 7:
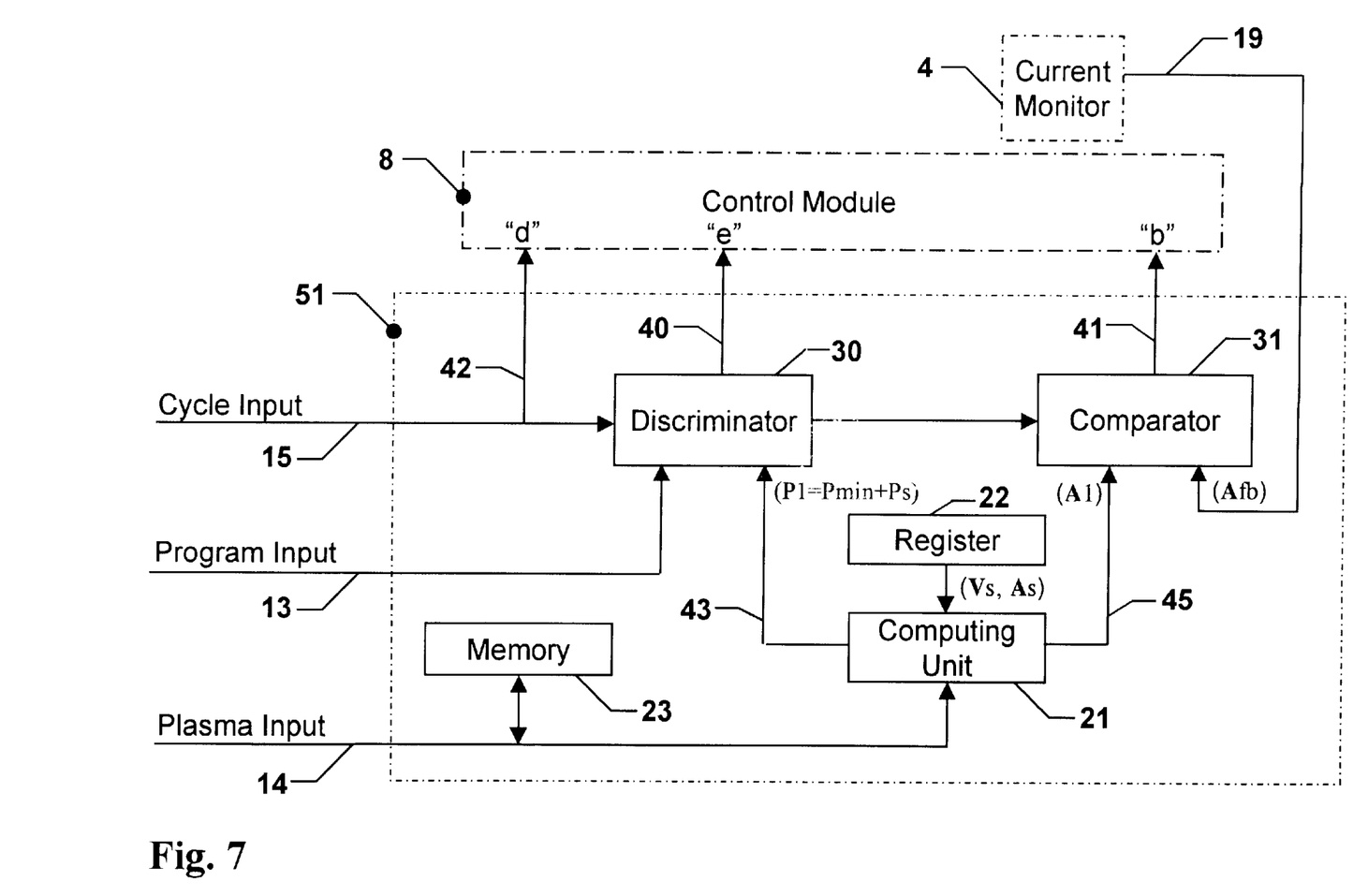
FIG. 7 is a schematic view of embodiment of plasma controller 51 of power supply 50 shown on FIGS. 5–6.

In embodiment shown on FIG. 7, controller 51 shares the same functional devices with controller 9, but the algorithm of operation is different.

In the voltage mode before and after a cycle of a sputter deposition, corresponding to the inactive state of a signal at input 15, discriminator 30:

disconnects unit 21 from module 8;
directs to module 8 a commanded value per input 13, thus setting the output voltage to 0 (zero).

Power mode of operation during a cycle of a sputter deposition relates to the active state of a signal at input 15.

While in the power mode if a signal per input 13 corresponds to the output power lower than P1, discriminator 30:

disconnects input 13 from module 8 and connects via interface 43 unit 21 to provide setting P1 to module 8;
configures comparator 31 to disconnect monitor 4 from module 8 and to connect via interface 45 unit 21 to provide setting A1 to module 8.

These commutations result in setting the output voltage to V1 and in no exposure of the process gas(es) at plasma ignition and termination to the output voltages lower then Vmin.

While in the power mode if signal per input 13 corresponds to the output power higher than P1, discriminator 30:

disconnects unit 21 from module 8, and directs to module 8 a commanded value per input 13;
configures comparator 31 to disconnect unit 21 from module 8 and to direct feedback Afb from monitor 4 to module 8.

These commutations result in switching control over the output from input 14 to input 13 and monitor 4.

Figure 8:
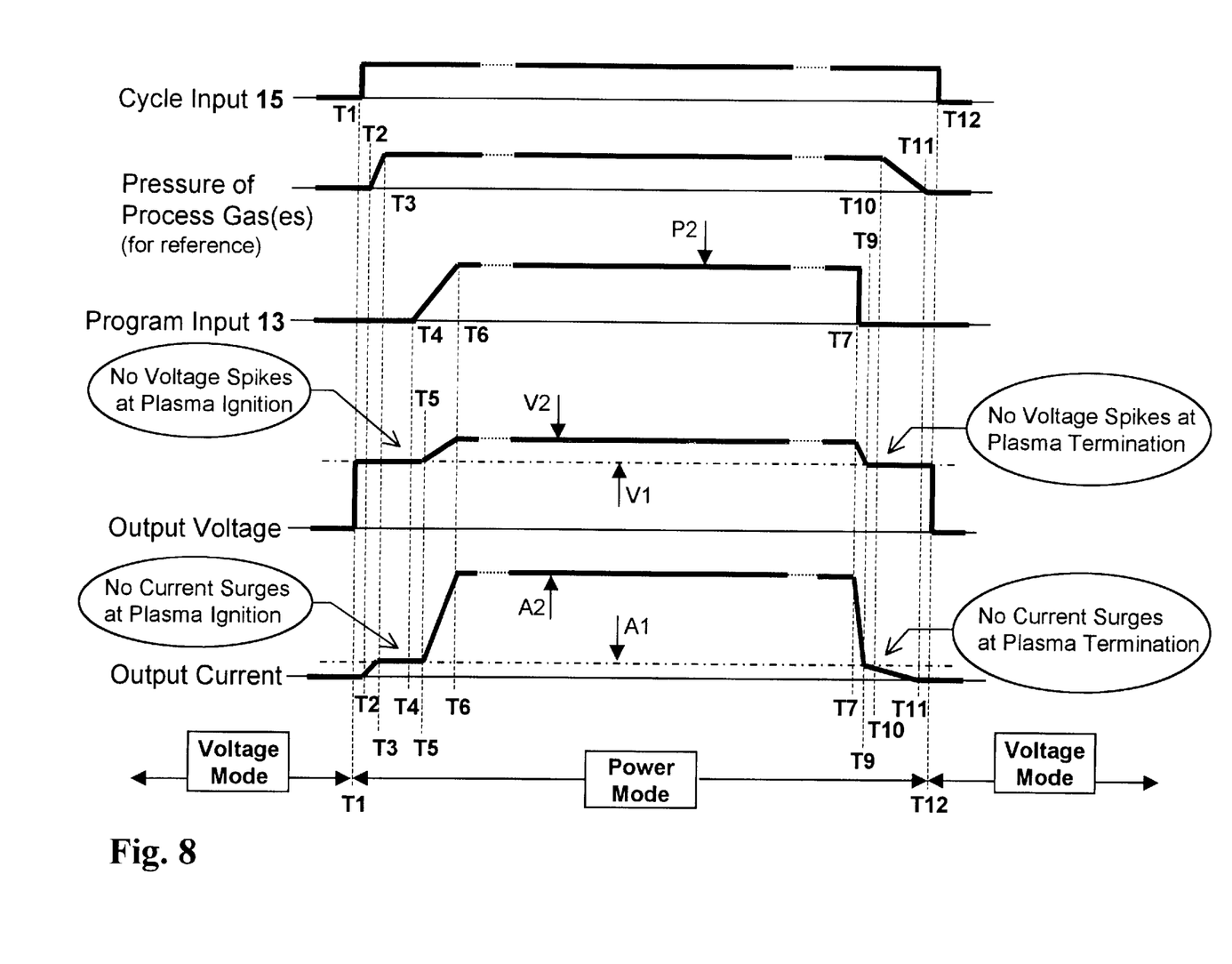
FIG. 8 is a typical timing diagram of embodiments shown on FIGS. 5–7.

Typical timing diagram of a sputter deposition with power supply 50 is shown on FIG. 8. On or prior to T1 settings Vmin, Amin are communicated to controller 51 via input 14, retrieved from memory 23, or manually entered in controller 51.

Before a cycle of sputtering at T<T1 a signal at input 15 is in the inactive (arbitrarily, low) state. In response, controller 51 via interface 42 and module 8 holds power supply 50 in the voltage mode while the output voltage is set to 0 (zero) per input 13.

At T1 a sputtering apparatus starts a cycle of a sputter deposition by setting a signal at input 15 to the active (high) state. Accordingly, at T1 controller 51 via interface 42 and module 8 switches power supply 50 to the power mode and sets output voltage to V1.

At T2 process gas(es) starts filling a sputtering apparatus in presence of the voltage V1 applied to a sputtering target.

At T3 pressure of the process gas(es) reaches the level per a process recipe.

At T4 a commanded value of the output power at input 13 starts increasing from the initial value of 0 (zero) reaching P1 at T5, and after T5 it exceeds the setting P1.

Accordingly, at T5 controller 51 via interfaces 40, 41 and module 8 switches control over the output at terminals 6, 7 from input 14 to input 13 and monitor 4. These transitions are executed with no output voltage drop below Vmin, and it is beneficial, but not critical, if they take little time.

By T6 a commanded value of the output power per input 13 increases to P2 and further it stays at a level higher then P1 till T7.

At T7 a sputtering apparatus sets a commanded value per input 13 to 0 (zero), and power supply 50 starts gradual transitioning of the output power from P2 to 0 (zero).

By T9 the output power decreases from P2 to P1, and after T9 it continues decreasing reaching Pout=0 at T11. Accordingly, at T9 controller 51 via interfaces 40, 41 and module 8 switches control over the output at terminals 6, 7 from input 13 and monitor 4 back to input 14 and sets the output voltage to V1. These transitions are executed with no output voltage drop below Vmin, and it is beneficial, but not critical, if they take little time.

At T10 evacuation of the process gas(es) starts, and by T11 vacuum is restored in a sputtering apparatus.

At T12 a sputtering apparatus sets a signal at input 15 to the inactive state and sets a commanded value per input 13 to 0 (zero). Accordingly, at T12 controller 51 (via interface 42 and module 8) switches power supply 50 to the voltage mode, sets the output voltage to 0 (zero) as per input 13, and a cycle of a sputter deposition is completed. Power supply 50 stays in the voltage mode from T12 to T1 of the next cycle of sputtering.

Power supply 50 provides the free of arcing plasma ignition and termination and it does not require a striking voltage to initiate plasma in a sputtering apparatus.

The embodiments and timing diagrams of power supplies 1 and 50 may have many modifications, including but not limited to:

- output power at a sputter deposition may stay constant from T6 to T7 or vary per input 13;
- output voltage Vout=V1 may be applied any time before T2 and may be removed any time after T11;
- setting Vmin, Amin, Pmin, Vs, As, Ps, V1, A1, P1 may be directly communicated via input 14 to controllers 9, 51 and/or stored in memory 23, thus eliminating a need in unit 21 and register 22;
- settings per input 14 may be saved in the data storage of module 8, thus eliminating a need in memory 23;
- dedicated inputs could be used to set the voltage mode at T<T1 and T>T12 , and to enable/disable controllers 9, 51 and the output of power supplies 1, 50;
- a cycle signal 15 may be interfaced directly with input "d" of module 8 for administering a mode of operation of power supply 50;
- gradual transitions of the output power from 0 (zero) to P2 and from P2 to 0 (zero) may take various time as administered by a sputtering apparatus or by module 8 and/or by controllers 9, 51 to assure realization of the described algorithms and the timing diagrams shown on FIGS. 4, 6;
- means to provide said gradual transitions in power supplies 1, 50 may include integrating circuits and/or other hardware and/or software means known to those skilled in the art;
- values of Pout, Vout, Aout during intervals from T2 to T6 and from T7 to T11 may be monitored/recorded for sputter deposition control purposes;
- controllers 9, 51 performing the described above algorithms may have various designs readily available to those skilled in the art;
- settings V1 may differ for transitions at plasma ignition and plasma termination, and if suppression of the arcing is desired only for either one transition, for the unprotected transition setting V1 could be set to 0 (zero);

However, these modifications do not effect the subject and objectives of the present invention.

Figure 11:
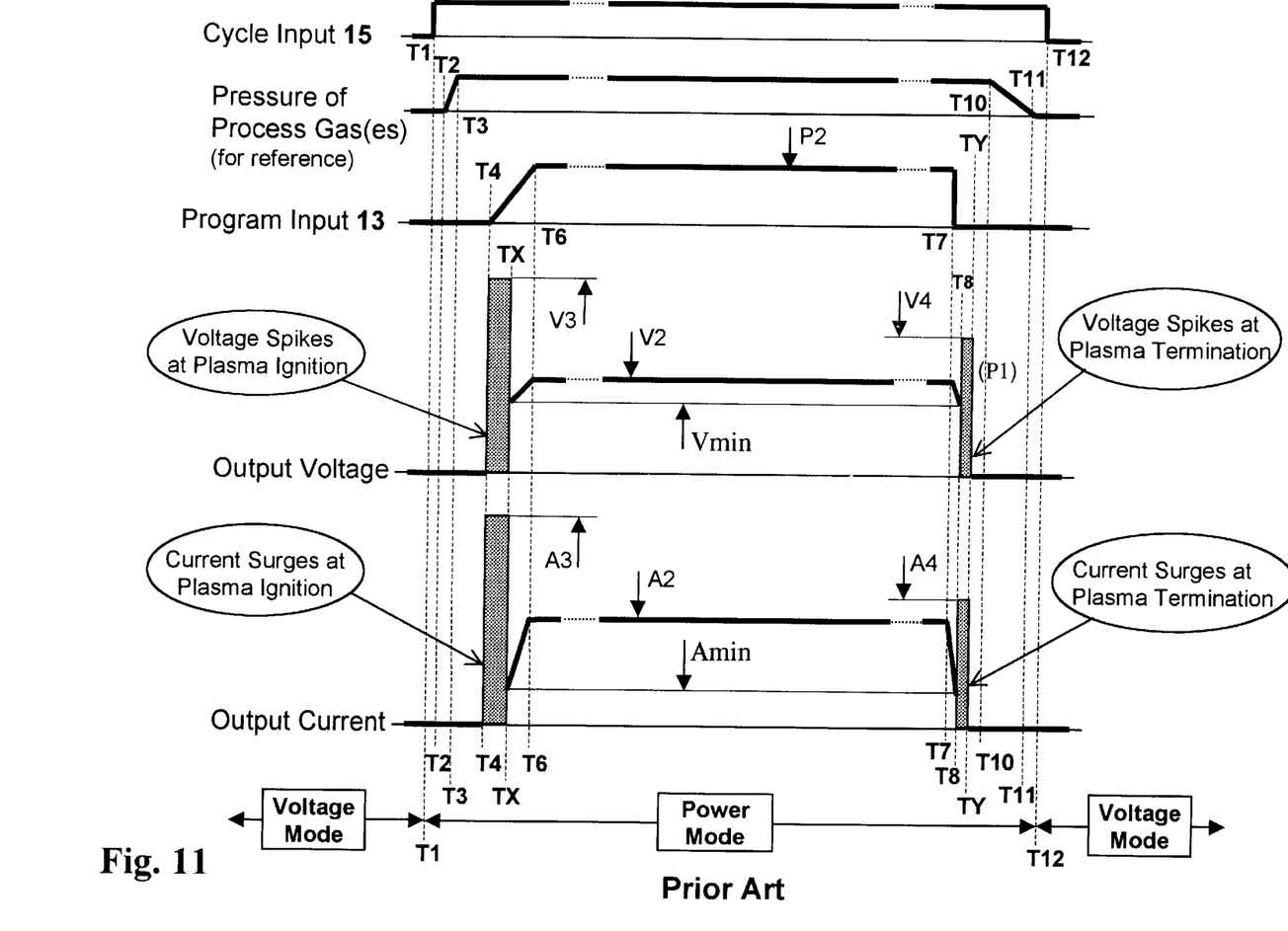
FIG. 11 is a typical timing diagram of a DC plasma power supply of the prior art.

To illustrate further advantages of this invention, DC plasma power supply 10 of the prior art and its typical timing diagram are shown on FIG. 10 and FIG. 11 respectively. Before a cycle of sputtering at T<T1 the inactive (arbitrarily, low) state of a signal at input 15 sets power supply 10 to the voltage mode, while the output voltage is set to 0 (zero) per input 13.

At T1 a sputtering apparatus starts a cycle of a sputter deposition by setting a signal at input 15 to the active (high) state. Accordingly, at T1 module 8 switches power supply 10 to the power mode.

At T2 process gas(es) starts filling a sputtering apparatus and by T3 pressure reaches the level per a process recipe.

At T4 a commanded value of the output power at input 13 starts increasing from the initial value of 0 (zero).

At T4, in response to a request of Pout greater than 0 (zero), power supply 10 produces a striking voltage, typically in a range of 1.5–2.5 kV.

The arcing at a sputtering target starts at T4 and continues until TX. Arcing at the plasma ignition is shown on FIG. 8 as bars V3, A3 (not to scale). It may last from several to hundreds of milliseconds.

At TX the output power stabilizes as it reaches the value of Pmin=Vmin*Amin. By T6 a commanded value of the output power per input 13 increases to P2 and further it stays at a level higher then P1 till T7.

At T7 a sputtering apparatus sets a commanded value per input 13 to 0 (zero), and power supply 10 starts transitioning of the output power from P2 to 0 (zero).

By T8 a commanded value of the output power per input 13 decreases from P2 to Pmin, and after T8 it continues decreasing reaching 0 (zero) at TY.

At T8 starts arcing somewhat similar to the observed from T4 to TX. Arcing at the plasma termination continues from T8 to TY and it is shown on FIG. 8 as bars V4, A4 (not to scale).

At T10 evacuation of the process gas(es) starts, and by T11 vacuum is restored in a sputtering apparatus.

At T12 a sputtering apparatus sets a signal at input 15 to the inactive state and sets a commanded value per input 13 to 0 (zero). Accordingly, module 8 switches power supply 10 to the voltage mode, sets the output voltage to 0 (zero), and a cycle of a sputter deposition is completed.

Power supply 10 stays in the voltage mode from T12 to T1 of the next cycle of a sputtering. If the output power temporarily decreases below Pmin during the interval from TX to T8, power supply 10 will terminate and re-ignite plasma with the repetitive arcing and with a striking voltage, as described above.

The embodiments and timing diagram of power supply 10 may have modifications, including but not limited to:

- output power at a sputter deposition may stay constant from T6 to T7 or vary per input 13;
- transitions of the output power from 0 (zero) to P2 and from P2 to 0 (zero) may take various time as commanded per input 13 or administered by module 8;
- power supply 10 may have dedicated means for gradual transitions from 0 (zero) to P2 and from P2 to 0 (zero);
- the voltage mode may be switched to the power mode any time before T6, and the power mode may be switched to the voltage mode any time after T7;
- dedicated inputs could be used to set the voltage mode at T<T1 and T>T12 and to enable/disable the output of power supplies 10.

However, these modifications do not eliminate the major drawbacks of power supply 10—repetitive arcing at plasma ignition and termination and a need in the striking voltage to initiate a plasma.

A preferred embodiment of the present invention can be built around the DC plasma power supplies of the prior art by means of controller 9, input 14, and interfaces 11, 17 or by means of controller 51, input 14, and interfaces 19, 40, 41, 42.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general concept.

What is claimed is:

1. DC plasma power supply for a sputter deposition in a sputtering appparatus of a material layer onto a substrate comprising:
   an AC-to-DC power conversion module;
   a filter and monitors of output current and output voltage of said power supply;
   a control module, regulating the mode of operation and output of said power supply;
   a plasma controller that controls plasma ignition and plasma termination;
   wherein the power supply eliminates arcing during the plasma ignition and plasma termination and eliminates a need of a striking voltage to initiate a plasma.

2. The DC plasma power supply of claim 1 wherein the plasma controller is a stand-alone apparatus interfaced with said power supply or said sputtering apparatus or both.

3. The DC plasma power supply of claim 1 wherein the plasma controller comprises:
   a cycle input to define a beginning and an end of a cycle of said sputter deposition;
   a program input for a commanded value of the output power or output voltage or output current at the output of said power supply;
   a plasma input for minimal setting for the output voltage and minimal setting for the output current during the plasma ignition and termination;
   outputs to define the mode of operation, the output voltage, the output current and the output power of said power supply during the plasma ignition and termination;
   at least one element of a computing unit, a comparator, a discriminator, a memory, and a register of safety margin.

4. The DC plasma power supply of claim 3 wherein the plasma controller:
   before and after said cycle of said sputter deposition:
      defines a voltage mode;
      directs to said control module said commanded value per said program input;
   during said cycle of said sputter deposition:
      defines safety margin that prevents the output voltage from decreasing below said minimal setting for the output voltage per said plasma input;
      defines settings for the output voltage and output current during the plasma ignition and plasma termination as increased by safety margin said minimal settings for the output voltage and output current per said plasma input;
      defines a setting for the output power during the plasma ignition and plasma termination as a product of increased by safety margin said minimal settings for the output voltage and output current per said plasma input;
      provides during the plasma ignition and plasma termination the output voltage equal to or greater than increased by safety margin said minimal setting for the output voltage per said plasma input.

5. The DC plasma power supply of claim 4 wherein the plasma controller during said cycle of said sputter deposition:
   defines the voltage mode if said commanded value for the output power per said program input is smaller than said defined setting for the output power;
   defines a power mode if said commanded value per said program input is greater than said defined setting for the output power;
   in the voltage mode provides said control module with said defined setting for the output voltage;
   in the power mode directs to said control module said commanded value per said program input.

6. The DC plasma power supply of claim 5 wherein:
   said computing unit calculates settings for the output power and output voltage during the plasma ignition and plasma termination and provides the settings to said comparator and to said discriminator respectively;
   said comparator defines the voltage mode if said commanded value for the output power per said program input is less than said calculated setting for the output power;
   said comparator defines the power mode if said commanded value for the output power per said program input is greater than said calculated setting for the output power;
   said discriminator in the voltage mode directs to said control module said calculated setting for the output voltage;
   said discriminator in the power mode directs to said control module said commanded value per said program input.

7. The DC plasma power supply of claim 3 wherein the plasma controller during a cycle of said sputter deposition:
   defines a power mode;
   defines a setting for the output power during the plasma ignition and plasma termination as a product of increased by safety margin said minimal settings for the output voltage and output current per said plasma input;
   replaces said commanded value for the output power per said program input with said defined setting for the output power if the setting is greater than said commanded value;
   replaces a feedback signal from said monitor of the output current with said defined setting for the output current if the setting is greater than said feedback signal.

8. The DC plasma power supply of claim 7 wherein:
   said computing unit calculates settings for the output power and output current during the plasma ignition and plasma termination and provides the settings to said discriminator and to said comparator respectively;
   said discriminator directs to said control module the greater of said calculated setting for the output power and said commanded value per said program input;
   if said calculated setting for the output power is greater than said commanded value per said program input, said comparator directs to said control module said calculated setting for the output current;
   if said calculated setting for the output power is less than said commanded value per said program input, said comparator directs to said control module the feedback signal from said current monitor of said power supply.

9. The DC plasma power supply of claim 3 wherein said beginning of a cycle of said sputter deposition is a beginning of introduction of process gas into said sputtering apparatus that was in a vacuum state prior to that introduction of the gas.

10. The DC plasma power supply of claim 3 wherein said end of a cycle of said sputter deposition is a return of said sputtering apparatus to the vacuum state after termination of introduction of process gas and termination of the plasma in said sputtering apparatus.

11. The DC plasma power supply of claim 3 wherein said minimal setting for the output voltage and said minimal setting for the output current are defined prior to said sputter deposition of a material layer onto the substrate.

12. The DC plasma power supply of claim 3 wherein said minimal setting for the output voltage and said minimal setting for the output current are the settings that eliminate arcing during the plasma ignition and plasma termination and eliminate a need of the striking voltage to initiate the plasma in said sputtering apparatus.

13. The DC plasma power supply of claim 3 wherein the plasma controller during the plasma ignition and plasma termination sets the output voltage of said power supply to a value that is equal to or greater than said minimal setting for the output voltage.

14. The DC plasma power supply of claim 3 wherein the plasma controller during the plasma ignition and plasma termination sets the output power of said power supply to a value providing the output voltage that is equal to or greater than said minimal setting for the output voltage.

15. The DC plasma power supply of claim 1 wherein the plasma controller has means of interface with said control module or said sputtering apparatus or both.

16. The DC plasma power supply of claim 1 having during the plasma ignition and plasma termination the output voltage set to a value that is equal to or greater than a value for maintaining a stable plasma in said sputtering apparatus.

17. The DC plasma power supply of claim 1 having during the plasma ignition and plasma termination the output power set to a value providing the output voltage that is equal to or greater than a value for maintaining a stable plasma in said sputtering apparatus.

18. The DC plasma power supply of claim 1 wherein said power supply after the plasma ignition during said sputter deposition until the plasma termination provides a steady DC output or a pulsed DC output or a combination of both.

19. The DC plasma power supply of claim 1 wherein the plasma controller entirely or in part is an element of said power supply or said sputtering apparatus or both.

20. The DC plasma power supply of claim 1 wherein the plasma controller is constructed as an electronic hardware or a software program or a combination thereof.

* * * * *